(12) United States Patent
Suzuki et al.

(10) Patent No.: US 8,754,382 B2
(45) Date of Patent: Jun. 17, 2014

(54) CHARGED PARTICLE BEAM DRAWING APPARATUS AND METHOD OF MANUFACTURING ARTICLE

(71) Applicant: Canon Kabushiki Kaisha, Tokyo (JP)

(72) Inventors: Takehiko Suzuki, Satte (JP); Yoshikiyo Yui, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/623,954

(22) Filed: Sep. 21, 2012

(65) Prior Publication Data

US 2013/0068959 A1    Mar. 21, 2013

(30) Foreign Application Priority Data

Sep. 21, 2011 (JP) ................. 2011-206556

(51) Int. Cl.
    *G01J 1/42*    (2006.01)
(52) U.S. Cl.
    USPC ....................................... 250/393
(58) Field of Classification Search
    USPC ............................... 9/393; 250/393
    See application file for complete search history.

(56) References Cited

U.S. PATENT DOCUMENTS 4,260,892 A * 4/1981 Kovacs et al. ............ 250/388

FOREIGN PATENT DOCUMENTS

JP        63-294254 A    11/1988
JP        2007-128914 A  5/2007

OTHER PUBLICATIONS

John et al., "Charged particle identification by pulse shape discrimination with single-sided segmented silicon-pad detectors," 2009, Nuclear Instruments and Methods in Physics Research A, vol. 609, pp. 24-31.*

* cited by examiner

*Primary Examiner* — Kiho Kim
(74) *Attorney, Agent, or Firm* — Rossi, Kimms & McDowell LLP

(57) ABSTRACT

A drawing apparatus includes: a detector configured to output a current in accordance with a pulse of a charged particle beam; and a processor including a capacitor and configured to detect a value of a voltage of the capacitor and to obtain an intensity of the pulse based on a value of a capacitance of the capacitor and the detected voltage value. The processor is configured to detect a current output from the detector in accordance with a charged particle beam incident thereon through a voltage drop, to supply a current having a value determined based on the detected current, to the capacitor to detect a value of a voltage of the capacitor, and to obtain the value of the capacitance based on the determined current value and the detected value of the voltage of the capacitor.

10 Claims, 9 Drawing Sheets

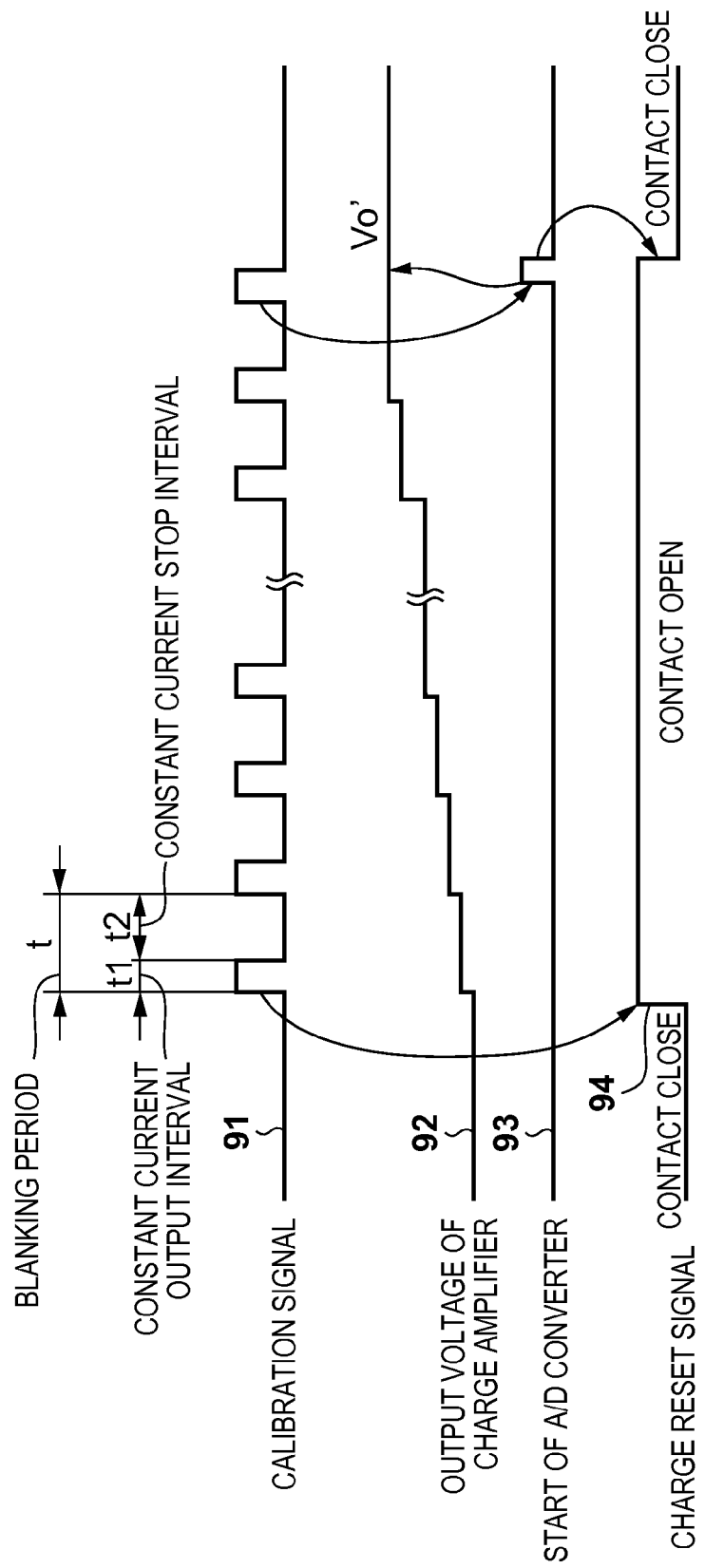

CHARGED PARTICLE BEAM DRAWING APPARATUS AND METHOD OF MANUFACTURING ARTICLE

BACKGROUND OF THE INVENTION

1. Field of the Invention

The present invention relates to a charged particle beam drawing apparatus and a method of manufacturing an article by using the apparatus.

2. Description of the Related Art

Recently, as an electron beam drawing apparatus used to manufacture semiconductor integrated circuits, a multi-electron beam drawing apparatus designed to perform drawing by using a plurality of electron beams has been developed with miniaturization of drawing patterns. A multi-electron beam drawing apparatus turns on and off a plurality of electron beams to form pulse beams, and irradiates a substrate with the formed pulse beams. As disclosed in Japanese Patent Laid-Open No. 2007-128914, in order to perform high-accuracy drawing, it is necessary to calibrate the dose of an electron beam. The dose of an electron beam is obtained by multiplying the current of an electron beam by an irradiation time.

In the multi-electron beam drawing apparatus, one electron beam is a weak, high-speed pulse beam. As a beam detection device for detecting such a weak, high-speed electron beam, a detection device having the property of multiplying incident electrons, such as an Si photodiode, is used. As a preamplifier circuit using an Si photodiode for a multi-electron beam drawing apparatus, an integrating circuit is known. That is, as disclosed in Japanese Patent Laid-Open No. 2007-128914, a method of integrating a current i of an electron beam with respect to a pulse count N by using an integrating circuit is known. This method transfers the signal detected by a detection device to the integrating circuit on the subsequent stage and measures the signal integrated by the integrating circuit. The integrating circuit converts the charge obtained by integrating the current generated by the detection circuit into a voltage and hence is called a charge amplifier. Charge Q is expressed as temporal integration of a current i according to equation (1):

$$Q = \int i\, dt \tag{1}$$

Using an Si photodiode as a beam detection device results in electronically multiplying the current of an incident electron beam because the Si photodiode has an electronically multiplication effect. The irradiation time of a pulse beam is expressed by the time obtained by integrating the ON time of a pulse beam. Letting i be the current of an electron beam incident on the beam detection device, G be the electron multiplication gain of the beam detection device, and T be the sum total of ON times of electron beams, the charge Q output from the beam detection device and accumulated in the charge amplifier is expressed by equation (2).

$$Q = i \times G \times T \tag{2}$$

The electron multiplication gain G of the beam detection device changes depending on the energy of electrons (accelerating voltage) incident on the Si photodiode. The multiplication gain is disclosed on a data sheet or research paper published by the maker of Si photodiodes. FIG. 3 shows an example of the arrangement of a charge amplifier 118. An operational amplifier 31 in use is a high-accuracy, high-band amplifier having properties such as high band, low noise, and low offset. A feedback condenser (capacitor) 32 has an electrostatic capacitance Cf and accumulates small charge obtained by integrating the current output from a beam detection device 112. A reset switch 33 discharges the charge accumulated in the feedback condenser 32. A distributing cable has an electrostatic capacitance Ci. In general, a coaxial cable is used as this cable. Depending on the type of coaxial cable to be used, its electrostatic capacitance is determined by specifications. For example, an RG/174/U coaxial cable has an electrostatic capacitance of 101.0 pF/m. The longer the cable, the larger the electrostatic capacitance. An input voltage is mainly a noise voltage with a voltage value Vi. The charge amplifier 118 outputs a voltage Vo.

The charge amplifier 118 uses the condenser 32 having the small electrostatic capacitance Cf as the feedback circuit of the operational amplifier 311, and converts input charge Qi into the voltage Vo. The relationship between these values can be expressed by equation (3):

$$Qi = Cf \cdot Vo \tag{3}$$

The following is a numerical example. This numerical example is written as an example in terms of calculation. Assume that the current i of an input beam is 50 pA, the electron multiplication gain G of the beam detection device 112 is 1000, and a beam ON time T is 100 µs. The numerical example is substituted into equation (2). As a result, Qi becomes 5 pC. In this case, if the electrostatic capacitance Cf of the feedback condenser 32 is 1 pF, an output of V0=5 V can be obtained from the charge amplifier 118 according to equation (3). In addition, in order to obtain a beam ON time of 100 µs, it is necessary to apply an electron beam 2,000 times, assuming that the ON/OFF period of a current is 10 MHz and the duty ratio is 50%. Using a detection device having no multiplication effect on the current of an electron beam such as a Faraday cup will make the input charge Qi of the charge amplifier 118 become 5 fC (femtocoulomb) even if the beam has the same current value as that described above. As a result, the voltage output from the charge amplifier 118 is 5 mV. As the current value of the electron beam further decreases, the output voltage Vo decreases and is buried in noise unless the electrostatic capacitance Cf of the feedback condenser 32 is reduced to a smaller value. As a result, the S/N ratio of the output excessively decreases to make it impossible to obtain necessary detection precision. In the charge amplifier 118, charge stays in a parasitic capacitance such as the electrostatic capacitance Ci generated in a wiring such as a cable or noise is generated when vibration acts on the cable.

As described in Japanese Patent Laid-Open No. 2007-128914, as the length of the distributing cable between the beam detection device 112 and the charge amplifier 118 increases, the parasitic capacitance error increases. In a multi-electron beam drawing apparatus designed to perform drawing by individually turning on and off n electron beams at high speed, the measurement time increases n times that in the case of a single beam. It is therefore necessary to shorten the measurement time. It is possible to shorten the integration time by decreasing the capacitance value of the condenser used for the integrating circuit to a small value and increasing the amplification component of an output voltage relative to an input voltage. When a movable stage incorporates the beam detection device 112 such as an Si photodiode, the state of the wiring between the beam detection device 112 and the charge amplifier 118 changes. In addition, since the amplification factor of the beam detection device 112 changes depending on the accelerating voltage of the electron source, it is difficult to apply constant charge to the input with predetermined charge conditions.

In the multi-electron beam drawing apparatus, since the measurement time is very long as compared with the case of a single beam, it is necessary to shorten the measurement time. In the above concrete numerical example, when obtaining the same output voltage, that is, 5 V, from the charge amplifier upon changing the beam ON time to 10 μs, the value of the feedback condenser of the charge amplifier becomes a very small capacitance value of 0.1 pF. Such a condenser with a small electrostatic capacitance is susceptible to the influence of circuit implementation and a parasitic capacitance such as a cable electrostatic capacitance. If the electrostatic capacitance of the condenser of the charge amplifier is not calibrated while the charge amplifier is mounted on the apparatus, it is not possible to accurately measure the current of an electron beam. This leads to a failure of properly calibrating the dose of an electron beam.

Japanese Patent Laid-Open No. 63-294254 discloses a constant charge generating apparatus which calibrates a charge amplifier. This constant charge generating apparatus is an apparatus which holds charge in a condenser and supplies charge to a charge amplifier. In this case, a change in the capacitance of the condenser makes it impossible to obtain a correct measurement value. In addition, the condenser which supplies charge is a condenser having a small capacitance value. In addition, a condenser which supplies charge and the feedback condenser of the charge amplifier are condensers having small capacitance values. Even when a small condenser having several pF is mounted on a circuit board, the capacitance value changes depending on the wiring pattern used. It is therefore necessary to calibrate the signal generator itself which performs calibration.

SUMMARY OF THE INVENTION

The present invention provides, for example, a drawing apparatus which is advantageous in terms of precision of measurement of an intensity of a pulse of a charged particle beam used for drawing.

The present invention in its one aspect provides a drawing apparatus which performs drawing on a substrate with a pulse of a charged particle beam, the apparatus comprising: a detector configured to output a current in accordance with a pulse of a charged particle beam incident thereon; and a processor including a capacitor which is charged with a current output from the detector in accordance with the pulse incident thereon, and configured to detect a value of a voltage of the capacitor, and to obtain an intensity of the pulse incident on the detector based on a value of a capacitance of the capacitor and the detected voltage value, wherein the processor includes a resistor, and is configured to detect a current output from the detector in accordance with a charged particle beam incident thereon through a voltage drop across the resistor, to supply a current, having a current value that is determined based on the detected current, to the capacitor to detect a value of a voltage of the capacitor to which the current having the determined current value is supplied, and to obtain the value of the capacitance based on the determined current value and the detected value of the voltage of the capacitor to which the current having the determined current value is supplied.

Further features of the present invention will become apparent from the following description of exemplary embodiments with reference to the attached drawings.

BRIEF DESCRIPTION OF THE DRAWINGS

FIG. 9 is a timing chart showing an example of the timing of the calibration current source and signal processing operation.

DESCRIPTION OF THE EMBODIMENTS

Figure 1:
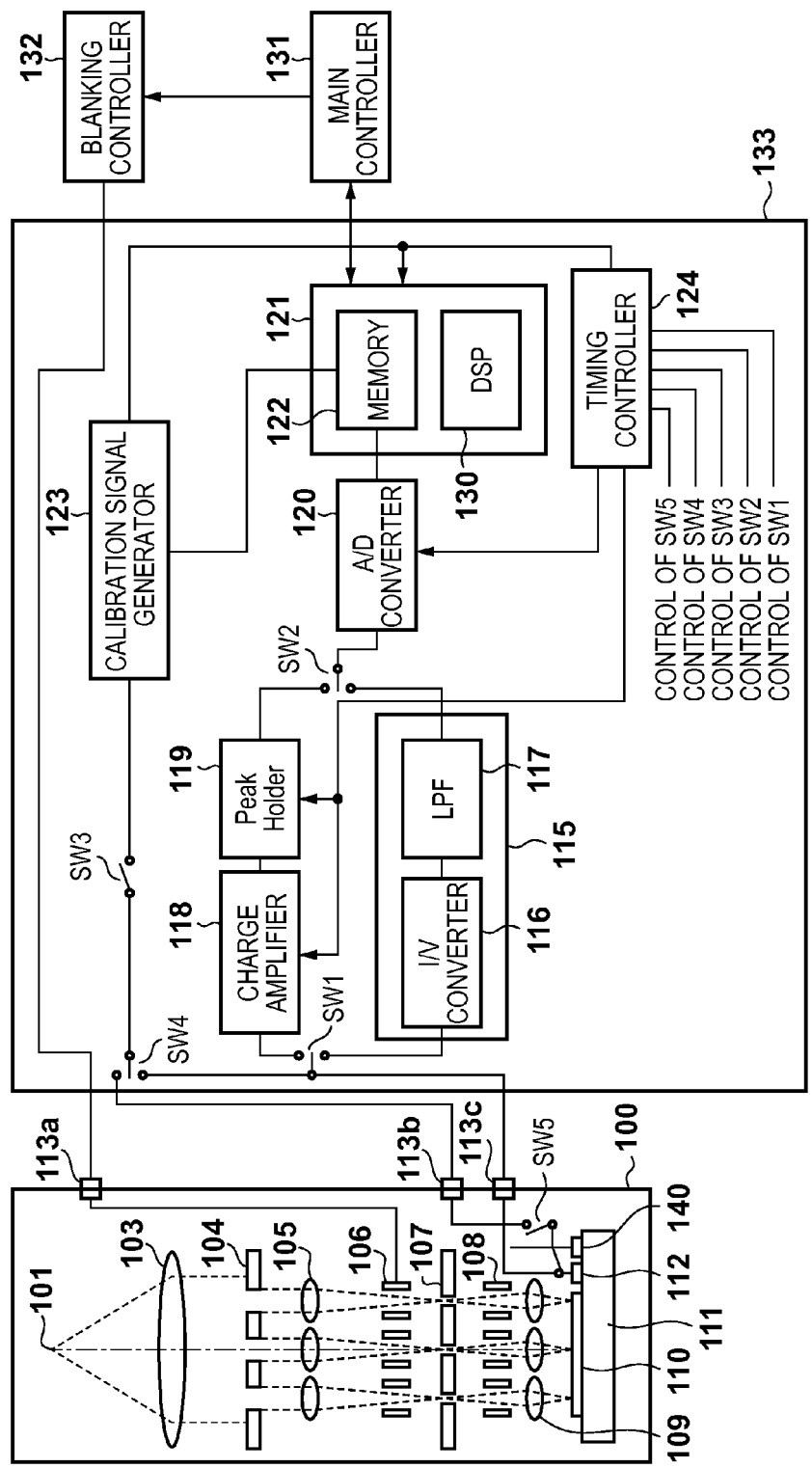
FIG. 1 is a block diagram showing the arrangement of an electron beam drawing apparatus.

The present invention can be applied to a drawing apparatus which performs drawing a pattern in each shot area by irradiating a substrate with a plurality of charged particle beams. The following is however a case in which the present invention is applied to a drawing apparatus which performs drawing by using a plurality of electron beams. Referring to FIG. 1, a vacuum column 100 has been evacuated to vacuum. An electron gun 101 generates an electron beam. A collimator lens 103 collimates a generated electron beam. An aperture array 104 splits an electron beam into multi beams. An electrostatic lens 105 converges an electron beam. A blanking array 106 is constituted by blanking electrodes which turn on and off multi beams. A blanking aperture array 107 shields electron beams bent by the blanking array 106. Deflector electrodes 108 scan multi beams. An electrostatic lens 109 converges an electron beam to form a drawing pattern on a substrate 110 such as a wafer. A detector (beam detection device) 112 is mounted on a movable stage 111 together with the substrate 110, and outputs a current corresponding to an incident electron beam. Vacuum current introduction terminals 113a to 113c guide wirings to the atmosphere. A control switch SW5 is a switch for connecting and disconnecting a wiring for wiring calibration to allow a current from a calibration current source to flow in from a wiring near the beam detection device 112. The control switch SW5 has a contact which is free from leakage currents and accumulates no charge. This switch can be on/off-controlled by external signals. As the beam detection device 112, it is possible to use a semiconductor detection device (SSD) such as an Si photodiode or avalanche photodiode which has a multiplication effect on electrons. A Faraday cup 140 is used to calibrate the absolute value of the beam detection device 112 having an electron multiplication effect like an Si photodiode.

An arrangement for performing signal processing of the current output from the beam detection device 112 will be described. A processor 133 performs signal processing of a current output from the beam detection device 112. A preamplifier 115 is configured to obtain a current value reference for the calibration of a charge amplifier 118. An I/V converter (current/voltage converter) 116 converts the current value of a continuous beam incident on the beam detection device 112 into a voltage value by using a voltage drop across a resistor. A low-pass filter (LPF) 117 cuts a high-frequency noise signal and passes a low-frequency band.

The charge amplifier 118 accumulates the current output from the beam detection device 112 as charge in the capacitor and converts the charge into a voltage. A peak holder 119 holds the peak value of the voltage value of the capacitor of the charge amplifier 118. The charge amplifier 118 and the peak holder 119 constitute a voltage detection device which charges a capacitor including a parasitic capacitance with a current corresponding to a pulse beam incident on the beam detection device 112 and detects the voltage value of the capacitor. A control switch SW1 switches connection to the beam detection device 112 between the preamplifier 115 and the charge amplifier 118. The operation of the control switch SW1 can be controlled from another device and has small leakage currents. A control switch SW2 switches between the voltage output of the peak holder 119 and the voltage output of the LPF 117. The control switch SW2 is also configured to be controlled.

An A/D converter (Analog/Digital converter) 120 converts a voltage into a digital value. A memory 122 stores the digital data converted by the A/D converter 120. A data calculation device 121 performs calculation processing for data stored in the memory 122. A DSP (Digital Signal Processor) 130 has a calculation function. The I/V converter 116 and the data calculation device 121, which calculates the current value of a continuous beam incident on the beam detection device 112 from the voltage value output from the I/V converter 116, constitute a current detection device which detects the current value of a continuous beam incident on the beam detection device 112. When the data calculation device 121 calculates a current value from the voltage value output from the charge amplifier 118, the data calculation device 121 forms the first calculator which calculates the intensity of a pulse beam incident on the beam detection device 112.

A calibration signal generator 123 generates a signal for the calibration of a current having a current value which is calculated by the data calculation device 121 and determined based on the current value stored in the memory 122, and supplies the signal to the charge amplifier 118. A control switch SW3 turns on and off the output of the calibration signal generator 123. A control switch SW4 switches to allow to select between receiving a calibration signal from the calibration signal generator 123 via a wiring near the charge amplifier 118 and receiving a calibration signal via a wiring near the beam detection device 112.

A timing controller 124 outputs a command signal for performing timing operation. The timing controller 124 operates with respect to each connection destination in the following manner. The timing controller 124 performs opening/ closing operation or connection destination switching operation with respect to the control switches SW1 to SW5. The timing controller 124 outputs, to the charge amplifier 118, a signal for causing the charge amplifier 118 to discharge accumulated charge. The timing controller 124 outputs a timing signal for resetting the timing of making the peak holder 119 hold a voltage and a held voltage value to 0 V. The timing controller 124 controls the output timing of a calibration signal from the calibration signal generator 123. A main controller 131 supplies data and an operation sequence to the data calculation device 121. The timing controller 124 outputs a blanking control signal from a current introduction terminal 113a to the blanking array 106, and outputs a timing signal for multi electron beam blanking operation (beam ON/OFF control). The timing signals generated by the timing controller 124 and the calibration signal generator 123 are controlled to establish synchronization via the main controller 131.

Figure 4:
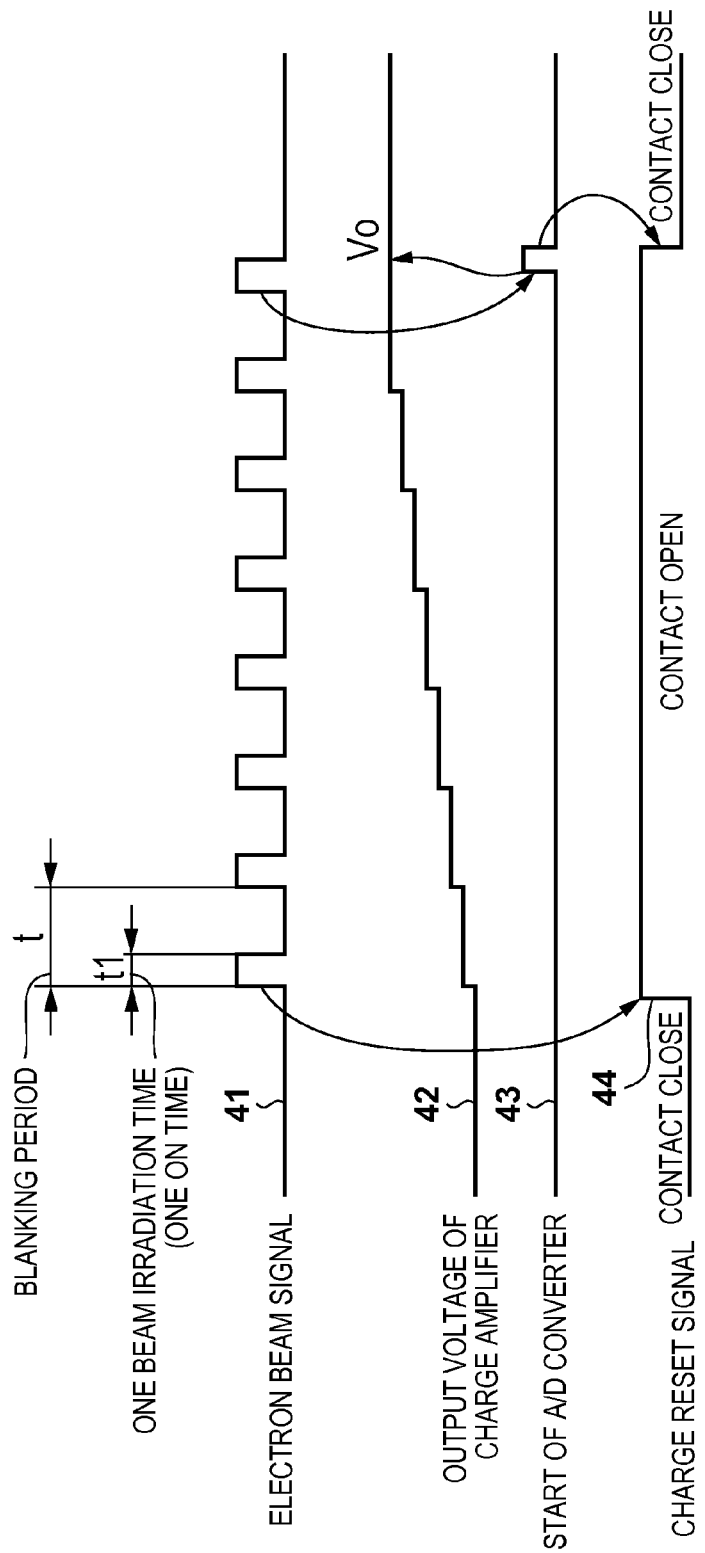
FIG. 4 is a timing chart at the time of exposure operation with a pulse beam using the charge amplifier.

FIG. 4 is a timing chart representing the operation timing of the charge amplifier 118 when the electron beam drawing apparatus is blanking-controlled to irradiate the beam detection device 112 with an electron beam. This timing chart shows an example of applying pulse beams corresponding to seven blanking periods and acquiring the data of charge corresponding to the currents output from the beam detection device 112 upon application of pulse beams seven times at a peak signal output Vo of the charge amplifier 118. An electron beam signal 41 indicates the timing of the blanking operation of turning on and off an electron beam. Let t1 be the ON time, and t be the blanking period as the sum of ON and OFF times. When the beam detection device 112 is irradiated with an electron beam for the time t1 along with the first electron beam signal 41, the beam detection device 112 outputs a current. The charge amplifier 118 accumulates charge corresponding to the output current in a feedback condenser (capacitor) 32. As a result, a staircase output voltage 42 is obtained from the charge amplifier 118. An exposure time is determined by the amount of exposure, that is, n times (n is an integer) of a blanking period. Irradiating the beam detection device 112 with an electron beam will increase a voltage in a staircase pattern. As a result, the voltage changes in a staircase pattern with time. Upon completion of application of an electron beam for a predetermined exposure time, the apparatus outputs a timing signal 43 for A/D conversion of the output voltage Vo from the charge amplifier 118. The memory 122 stores the voltage data digitized by the A/D converter 120.

It is possible to obtain input charge from the voltage data stored in the memory 122 according to equation (3). A current value Io output from the beam detection device 112 is obtained by equation (4). In equation (4), Cf is the capacitance value of the capacitor 32 including a parasitic capacitor, and Vo is the output voltage from the charge amplifier 118 shown in FIG. 4. An integration time is the time obtained by multiplying t1 by n (n is an integer) (n is 7 in the case shown in FIG. 4).

$$Io = Cf \cdot Vo/(n \cdot t1) \quad (4)$$

A current value Ie corresponding to the intensity of an electron beam incident on the beam detection device 112 is obtained by dividing the current value Io by an electron multiplication gain G indicated by equation (2) according to equation (5):

$$Ie = Io/G = Cf \cdot Vo/(n \cdot t1 \cdot G) \quad (5)$$

Of the parameters for obtaining the current Ie of an electron beam, n and t1 can be managed as digital signals and hence can be easily kept accurate. In consideration of a temporal change of the beam detection device (Si photodiode), it is necessary to update the data value of the electron multiplication gain G by periodic measurement. It is possible to calibrate the electron multiplication gain G by comparative calibration with a detection device such as a Faraday cup. In calibration, since the multiplication gain of the beam detection device 112 depends on the accelerating voltage of an electron beam, a continuous beam irradiation method can be used after accelerating voltage conditions are determined. The I/V converter 116 can measure the current of a continuous beam even if it is small. In this case, it is possible to accurately measure a current because the measurement is robust against the influences of the wiring state of a cable and the like, unlike the case of using the charge amplifier 118 for calibration. The apparatus obtains the electron multiplication gain G from the comparison between current values by measuring small currents with the I/V converter 116 upon switching between the Si photodiode and the Faraday cup. The output current obtained when the current of an electron beam is incident on the Si photodiode is the current value obtained by multiplying an output current value from the Faraday cup by the electron multiplication gain. Mounting a plurality of feedback resistors in the I/V converter 116 and using it while switching proper gains can obtain output voltages from the I/V converter 116 in a proper range.

As a feedback condenser 32 of the charge amplifier 118, a condenser having a small capacitance value is required. An output voltage from the charge amplifier 118 becomes the value obtained by dividing input charge Qi by a capacitance value Cf of the feedback condenser 32. If the input charge is small, in order to increase the output voltage, it is necessary to decrease the capacitance value of the feedback condenser 32. Since it is necessary to perform A/D conversion of small charge with high precision, the S/N ratio needs to be equal to or higher than a predetermined value. The S/N ratio needs to become a large value relative to a noise level in at least one irradiation time t1. In addition, since there is a risk that the S/N ratio will change depending on the parasitic capacitance in a wiring or the like and the implementation state of the charge amplifier 118, it is necessary to periodically perform calibration.

Figure 2:
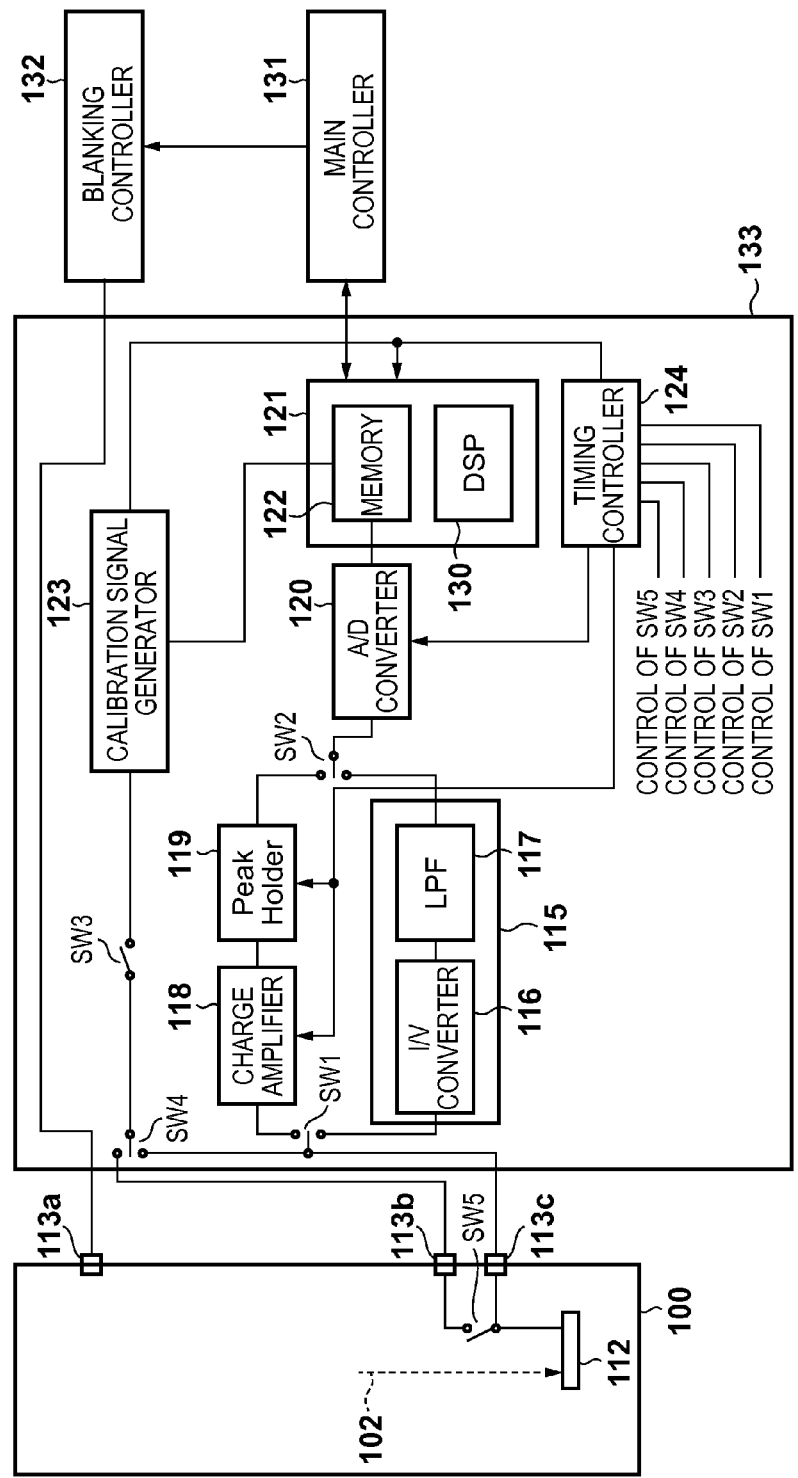
FIG. 2 is a block diagram for explaining the operation of calibrating a charge amplifier.
Figure 3:
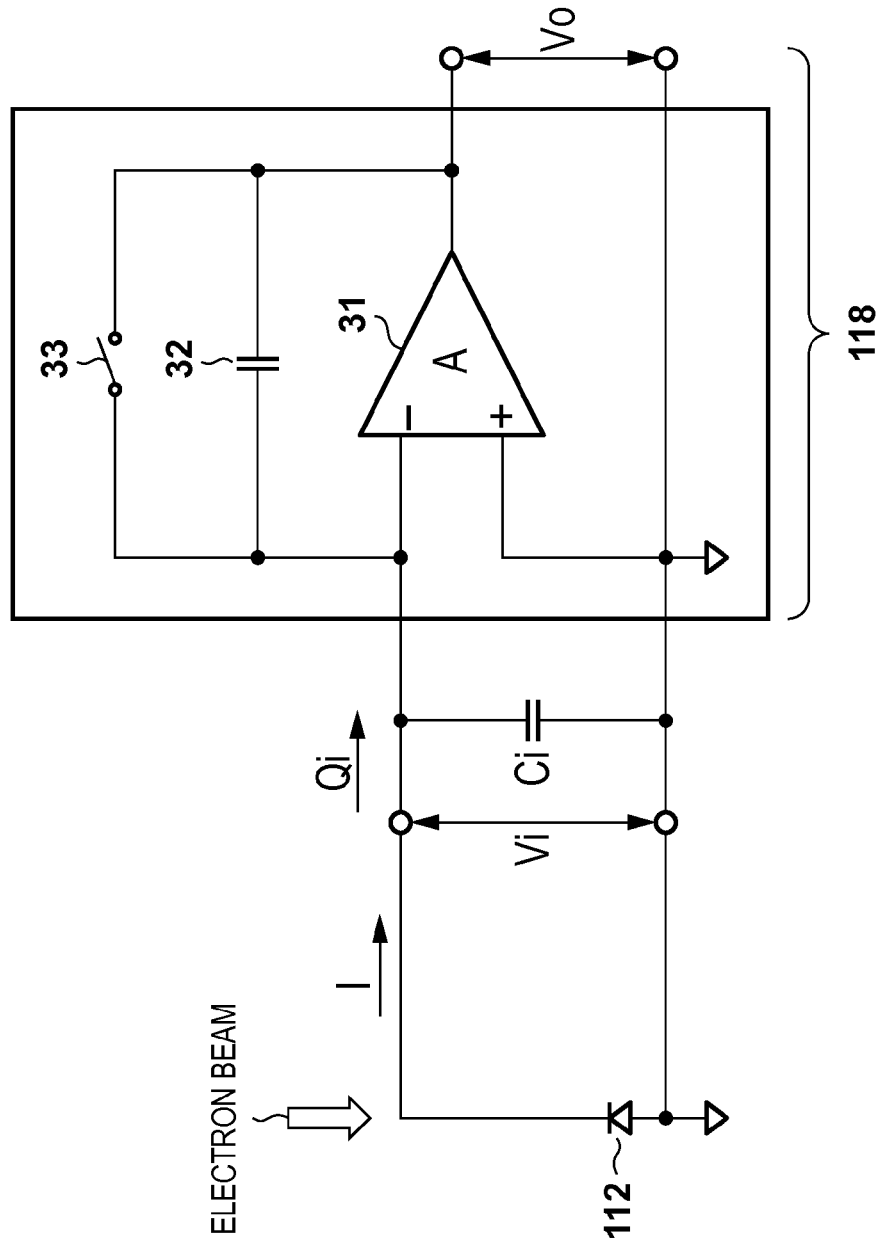
FIG. 3 is a circuit diagram of the charge amplifier.
Figure 5:
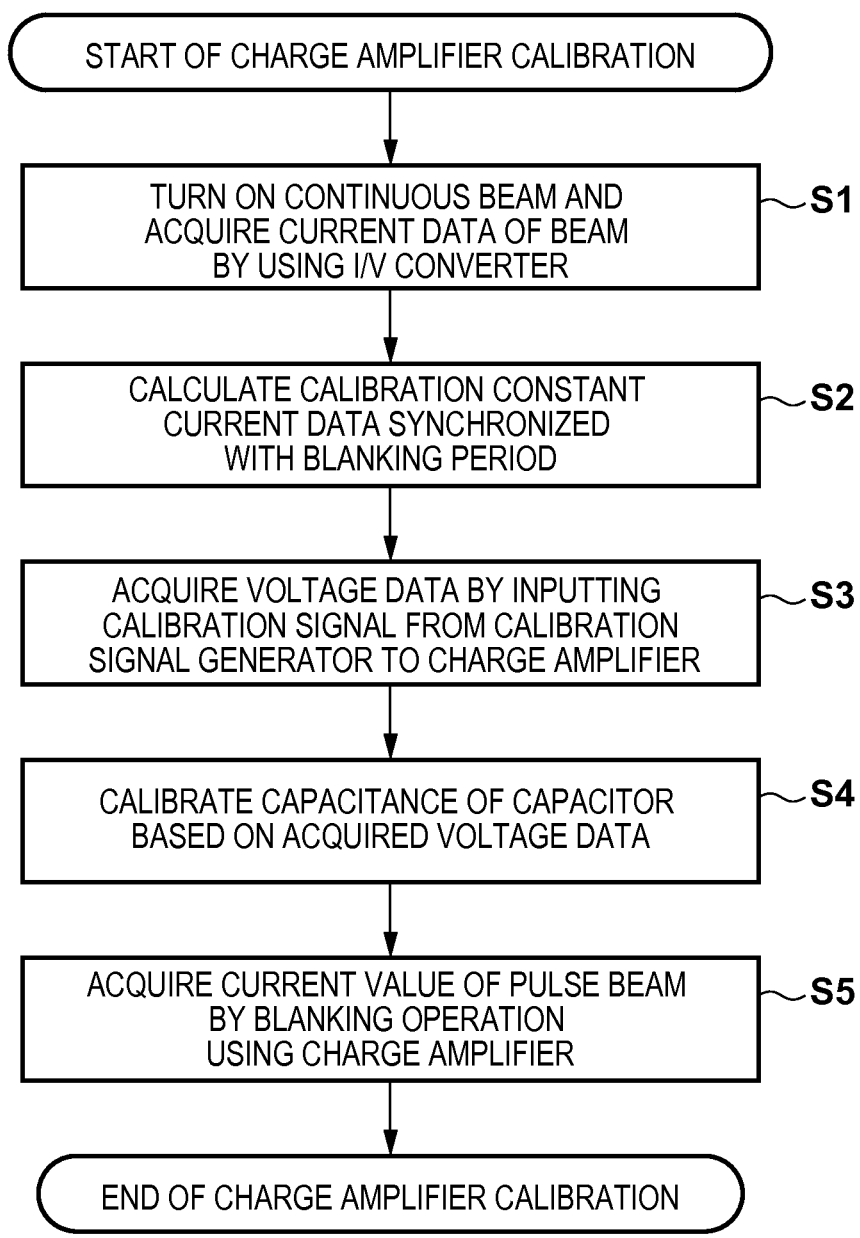
FIG. 5 is a flowchart showing the calibration of the charge amplifier.
Figure 6:
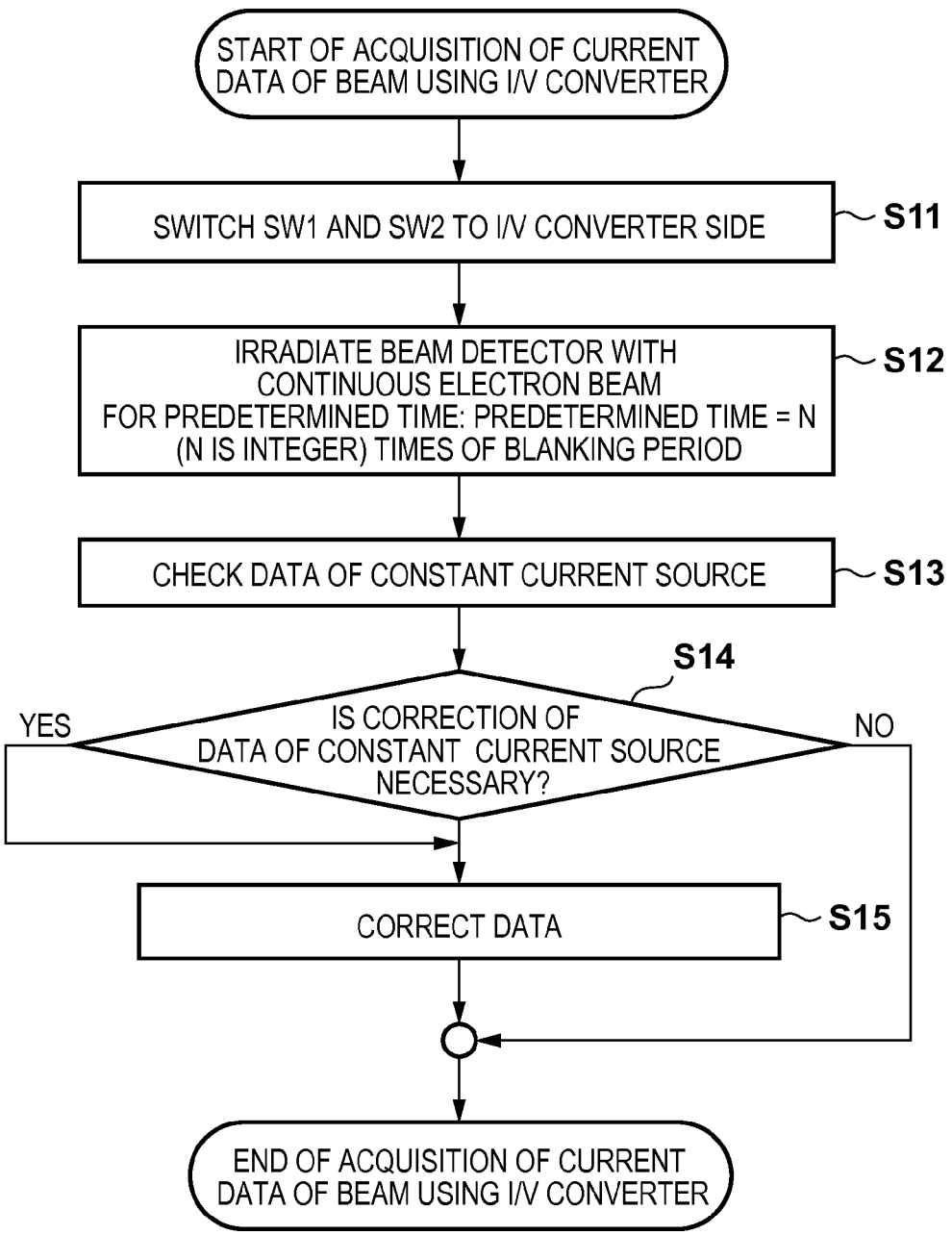
FIG. 6 is a flowchart for acquiring current data of a beam by using an I/V converter.
Figure 7:
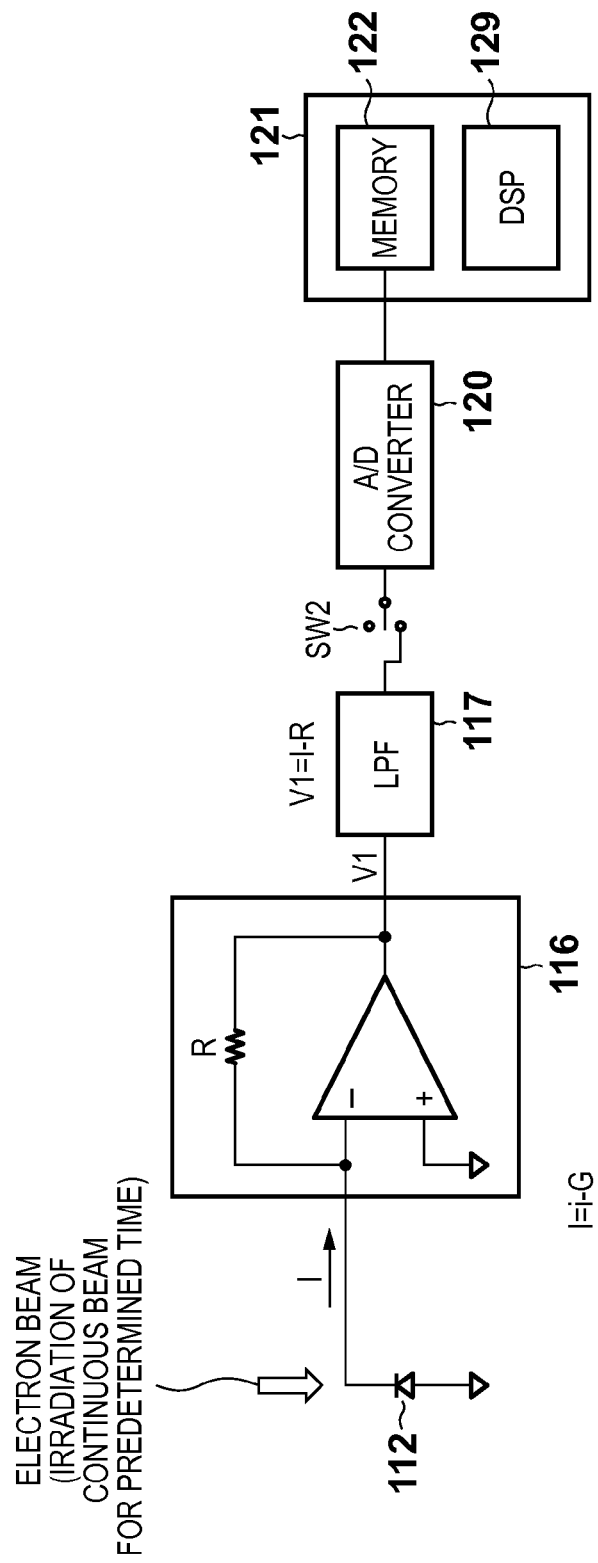
FIG. 7 is a block diagram showing a main arrangement for acquiring a reference current value for the calibration of the charge amplifier using a continuous beam.

A method of calibrating the capacitance value Cf of the capacitor including a parasitic capacitor in the charge amplifier 118 of the system designed to measure the current of an electron beam will be described with reference to the flowcharts of FIGS. 5 and 6 and the block diagrams of FIGS. 2 and 7. FIG. 5 is a flowchart showing a procedure for calibrating the charge amplifier 118. In step S1, the data calculation device 121 acquires the current data of a continuous beam from an output from the I/V converter 116 using a continuous beam. FIG. 6 is a flowchart showing a sequence of operation of causing the data calculation device 121 to acquire the current data of a continuous beam in step S1. The detailed procedure in step S1 will be described with reference to the flowcharts of FIGS. 2 and 6. In step S11, the timing controller 124 switches the control switch SW1 in the block diagram of FIG. 2 to connection to the I/V converter 116. At the same time, the timing controller 124 switches the control switch SW2 to connect the LPF 117 to the A/D converter 120. In step S12, the main controller 131 irradiates the beam detection device 112 with a continuous beam. If the irradiation time is equal to the exposure time, an average current within the exposure time can be obtained. It is therefore preferable to set such times. FIG. 7 shows a main arrangement as an excerpt for the signal processing in step S12. The I/V converter 116 converts a current into a voltage. The A/D converter 120 digitizes a voltage from which noise is removed by the LPF 117. The memory 122 temporarily stores the digitized sample data. The data calculation device 121 performs conversion to a current value as numerical calculation and averaging calculation of current values, thereby obtaining an average value Iav of output current values from the beam detection device 112 within the exposure time. In step S13, this arrangement checks any difference error between the current data value output from the beam detection device 112 and the current value output from the calibration signal generator 123. If there is an error, the arrangement corrects the error. The calibration signal generator 123 outputs a DC current as a constant current based on the data value of the average value Iav of output current values from the beam detection device 112. It is possible to form a constant current source which can be used up to a high-frequency band by using a known technique.

The timing controller 124 closes the control switch SW3 before a DC current as a constant current is output. The timing controller 124 switches the control switch SW4 to connect to a wiring line on the beam detection device 112 side. The timing controller 124 also keeps the control switch SW5 on. Upon completion of the operation of control switches SW3, SW4, and SW5, the calibration signal generator 123 outputs a constant current signal equivalent to the average current data Iav for the same time as the exposure time. In this embodiment, the constant current signal output from the calibration signal generator 123 has the same current value as the average current data Iav. However, this signal need not have the same current value as the average current data Iav as long as it has a constant current value corresponding to the capacitance value of the capacitor of the charge amplifier 118. In this embodiment, the calibration signal generator 123 outputs a constant current signal. However, the calibration signal generator 123 may generate a constant charge signal and supply it to the charge amplifier 118. The calibration signal generator 123 forms a supply device which supplies a constant current signal to the charge amplifier 118.

Figure 8:
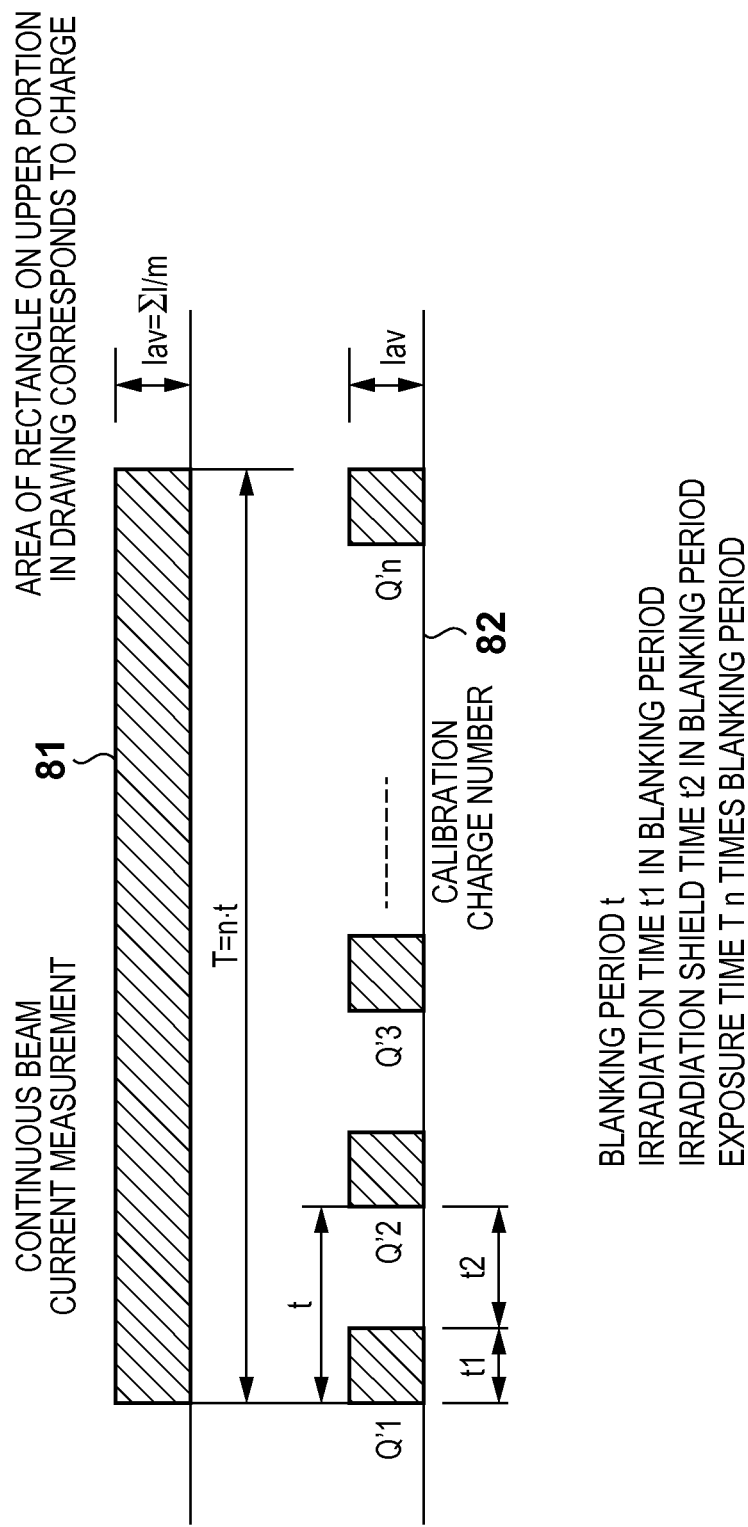
FIG. 8 is a timing chart showing an example of the timing of a calibration current source.

FIG. 8 shows the waveforms of an output current 81 and charge signal 82 of the beam detection device 112 irradiated with a continuous beam. The average value Iav of output current values of the beam detection device 112 is obtained as an average current in an exposure time T (=n·t). The calibration signal generator 123 has a function of outputting a constant current as an analog constant current source upon receiving digital data equivalent to a current value. The data calculation device 121 inputs digital data to output the constant current value Iav to the calibration signal generator 123. The following are conditions for the control switches when the calibration signal generator 123 outputs an output current. The timing controller 124 performs control to close the control switch SW3, connect the control switch SW4 to the current introduction terminal 113b side, close the control switch SW5, connect the control switch SW1 to the I/V converter 116 side, and make the control switch SW2 connect the LPF 117 to the A/D converter 120. The calibration signal generator 123 outputs a constant current signal of the current value Iav as a signal substituting a current output from the beam detection device 112.

The A/D converter 120 A/D-converts output voltages from the I/V converter 116 and the LPF 117, and temporarily stores the resultant data in the memory 122. In step S14, the data calculation device 121 obtains average current data Iav' and determines whether its difference from the constant current value Iav falls within an allowable error. If the difference between the average current data Iav' and the constant current value Iav falls within a predetermined error in step S14, the apparatus finishes the beam current data acquiring operation in the I/V converter 116. If the difference between the average current data Iav' and the constant current value Iav exceeds the error in step S14, the data calculation device 121 corrects the data in step S15. An error range is obtained in advance from the detection precision for beam currents. An error component can be regarded as a noise component from a cable wiring. The LPF 117 can remove the high-frequency component of a ripple component. It is possible to correct a DC component (offset component) in a low-frequency band by a method of measuring an offset component in the I/V converter 116 and subtracting it. This correction processing is well known as a conventional technique of correcting a dark current in an optical sensor. With the above processing, the apparatus completes step S1 which is the step of acquiring the current data of a beam by the I/V converter 116.

The following is the signal processing in step S3 in FIG. 5 in which the calibration signal generator 123 inputs a calibration signal to the charge amplifier 118 to acquire voltage data. FIG. 8 shows the generation timing of the charge signal 82 for calibration. Let t be the blanking period, t1 be the irradiation time of an electron beam in a blanking period, t2 be the radiation shield time in a blanking period, and T be the exposure time. Reference symbols Q'1 to Q'n each represent the charge generated by the beam detection device 112 for each irradiation. The height of each rectangle represents the average current value Iav. The area of the hatched rectangle represents a charge amount. A charge amount per irradiation can be calculated by t1·Iav. An integral charge amount in the exposure time T is represented by n·t1·Iav. A way of supplying a charge signal to the charge amplifier 118 will be described. Referring to FIG. 2, when inputting a charge signal to the charge amplifier 118, the apparatus performs control to close the control switch SW3, connect the control switch SW4 to the current introduction terminal 113b side, close the control switch SW5, and connect the control switch SW1 to the charge amplifier side.

FIG. 9 shows the input timing of a calibration signal. When the calibration signal generator 123 outputs a calibration signal 91, the constant current Iav is output in a constant current output interval t1 in a blanking period t. The calibration signal 91 is supplied to the charge amplifier 118 via the wiring route of the beam detection device 112, the current introduction terminal 113c, and the control switch SW1. In order to minimize an error due to the wiring between the calibration signal generator 123 and the beam detection device 112, the calibration signal generator 123 is located near the beam detection device 112, that is, located as nearer to the current introduction terminal 113b as possible. Therefore, the transmission path which connects the calibration signal generator 123 to the beam detection device 112 is shorter than the transmission path which connects the charge amplifier 118 to the beam detection device 112.

An output voltage 92 from the charge amplifier 118 increases in a staircase pattern as charge is accumulated in the feedback condenser 32 for each blanking period. After the elapse of exposure period=n·t, a voltage Vo' is output. A start signal 93 for the A/D converter is output at the timing of A/D conversion of the output voltage Vo'. A charge reset signal 94 makes the feedback condenser 32 of the charge amplifier 118 discharge accumulated charge and then newly accumulate charge. During charge accumulating operation, the contact 33 is open to accumulate charge. Upon completion of A/D conversion by the A/D converter 120, the contact 33 is closed to short-circuit the two ends of the feedback condenser 32 to discharge accumulated charge. Integrating outputs from the charge amplifier 118 during an exposure period will obtain voltage data.

A method of acquiring the waveform data of an output voltage from the charge amplifier 118 for each blanking period will be described next. The A/D converter 120 converts all the output data from the charge amplifier 118 until the calibration signal generator 123 outputs all the inputs of constant currents from the first input to the nth input into digital data. The memory 122 stores the converted digital data. The stored waveform data of an output voltage from the charge amplifier 118 allows to check the time difference from the calibration signal generator 123 to the A/D converter 120, a signal response, and the like. Setting the start timing of the A/D converter 120 to the timing at which the calibration signal generator 123 outputs a constant current signal can continuously digitize data. The charge reset signal 94 represents the open/closed state of the reset switch 33 for discharging the charge accumulated in the charge amplifier 118. At the timing of accumulating charge, the reset switch 33 is open. Upon completion of charge accumulating operation and signal processing of necessary data, the reset switch 33 is closed to perform charge discharging operation. In step S4 in FIG. 5, the data calculation device 121 calculates the capacitance value Cf of the feedback condenser 32 of the charge amplifier 118 based on the data which is obtained by A/D-converting the voltage Vo' from the charge amplifier 118 and stored in the memory 122 in step S3. The data calculation device 121 which calculates the capacitance value Cf of the feedback condenser 32 forms the second calculator which calculates the capacitance value of the capacitor by using the voltage value detected by the voltage detection device and the determined current value. The capacitance value Cf of the capacitor is obtained by $$Cf = Q'/Vo' = n \cdot t1 \cdot Iav/Vo' \qquad (6)$$

In this case, the temporal precision of the timing periods t and t1 can be made high because a known circuit capable of keeping accurate time such as a PLL circuit can be used. It is possible to check time response characteristics by inputting a constant current source with an accurate timing and a rectangular wave to the charge amplifier 118 and comparing an output voltage waveform with an input portion. Switching the control switch SW4 can select between a case in which a calibration signal is input near the charge amplifier 118 and a case in which a calibration signal is input near the beam detection device 112. This makes it possible to check the influences of wirings by comparing the signal output waveform of the charge amplifier 118 in a case in which a calibration signal is input near the charge amplifier 118 with that in a case in which a calibration signal is input near the beam detection device 112. Although a constant current source is input with a pulse-like waveform, a continuous current in a range represented by T in FIG. 8 may be input (continuously applying a beam in terms of apparatus operation). In this operation, the stepwise increase in FIG. 9 becomes a smooth continuous increase. The capacitance value Cf in this case is obtained by equation (7). This makes it possible to correct errors from the preamplifier 115.

$$Cf = Q'/Vo' = T \cdot Iav/Vo' \qquad (7)$$

In this manner, upon correcting the influence of the parasitic capacitance due to wirings, the apparatus can obtain the average value of currents in an electron beam irradiation time by acquiring a current of a pulse beam in blanking operation by the charge amplifier 118 in step S5 in FIG. 5 and using equation (2). It is possible to accurately correct the electron beam irradiation time from the obtained average value of currents. The main controller 131 in FIG. 1 compares the beam current value obtained by the calibration signal generator 123 with the beam current value obtained when the beam detection device 112 detects a pulse beam in blanking operation. It is possible to correct the electron beam dose of the electron beam drawing apparatus by sending the error amount of a beam current value to a blanking controller 132 and making the blanking controller 132 adjust the ON time t1 as an irradiation time. The electron beam drawing apparatus of this embodiment incorporates a device which calibrates the capacitance value of the charge amplifier which measures the current value of an electron beam, and hence can automatically calculate the capacitance value of the charge amplifier. The electron beam drawing apparatus of the embodiment then calculates the intensity of an electron pulse beam to be used for drawing by using a calibrated capacitance value, and performs drawing on a substrate while monitoring the calculated intensity.

Embodiment of Method of Manufacturing Article

A method of manufacturing an article according to an embodiment of the present invention is suitable for manufacturing an article including a microdevice such as a semiconductor device or an element having a microstructure. This manufacturing method can include the step of forming a latent image pattern on a photosensitizing agent applied on a substrate by using the above drawing apparatus (the step of performing drawing on a substrate) and the step of developing the substrate on which the latent image pattern has been formed in the preceding step. The manufacturing method can further include other known steps (oxidation, film formation, deposition, doping, planarization, etching, resist peeling, dicing, bonding, packaging, and the like). The method of manufacturing an article according to this embodiment is superior to the conventional method in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-206556 filed Sep. 21, 2011, which is hereby incorporated by reference herein in its entirety.

What is claimed is:

1. A drawing apparatus which performs drawing on a substrate with a pulse of a charged particle beam, the apparatus comprising:
a detector configured to output a current in accordance with a pulse of a charged particle beam incident thereon; and
a processor including a capacitor which is charged with a current output from the detector in accordance with the pulse incident thereon, and configured to detect a value of a voltage of the capacitor, and to obtain an intensity of the pulse incident on the detector based on a value of a capacitance of the capacitor and the detected voltage value,
wherein the processor includes a resistor, and is configured to detect a current output from the detector in accordance with a charged particle beam incident thereon through a voltage drop across the resistor, to supply a current, having a current value that is determined based on the detected current, to the capacitor to detect a value of a voltage of the capacitor to which the current having the determined current value is supplied, and to obtain the value of the capacitance based on the determined current value and the detected value of the voltage of the capacitor to which the current having the determined current value is supplied.

2. The apparatus according to claim 1, wherein the processor includes a voltage detection device configured to detect a value of a voltage of the capacitor, and a supply device configured to supply a current having the determined current value to the capacitor, and
a transmission path which connects the supply device with the detector is shorter than a transmission path which connects the voltage detection device with the detector.

3. The apparatus according to claim 1, wherein the processor is configured to cause a continuous charged particle beam to be incident on the detector if the processor detects the current output from the detector through the voltage drop across the resistor.

4. A method of manufacturing an article, the method comprising:
performing drawing on a substrate using a drawing apparatus;
developing the substrate on which the drawing has been performed; and
processing the developed substrate to manufacture the article,
wherein the drawing apparatus performs drawing on the substrate with a pulse of a charged particle beam, the apparatus includes:
a detector configured to output a current in accordance with a pulse of a charged particle beam incident thereon; and
a processor including a capacitor which is charged with a current output from the detector in accordance with the pulse incident thereon, and configured to detect a value of a voltage of the capacitor, and to obtain an intensity of the pulse incident on the detector based on a value of a capacitance of the capacitor and the detected voltage value,
wherein the processor includes a resistor, and is configured to detect a current output from the detector in accordance with a charged particle beam incident thereon through a voltage drop across the resistor, to supply a current, having a current value that is determined based on the detected current, to the capacitor to detect a value of a voltage of the capacitor to which the current having the determined current value is supplied, and to obtain the value of the capacitance based on the determined current value and the detected value of the voltage of the capacitor to which the current having the determined current value is supplied.

5. A drawing apparatus which performs drawing on a substrate with a charged particle beam, the apparatus comprising:
a detector configured to detect a charged particle beam incident thereon;
a capacitor configured to be charged with an output from the detector in accordance with the charged particle beam incident on the detector;
a processor configured to detect a value of a voltage of the capacitor, and to obtain an intensity of the charged particle beam incident on the detector based on a value of a capacitance of the capacitor and the detected voltage value; and
a resistor,
wherein the processor is configured to detect an output from the detector in accordance with a charged particle beam incident on the detector through a voltage drop across the resistor, to supply a current, having a current value determined based on the detected output to the capacitor to detect a value of a voltage of the capacitor to which the current having the determined current value is supplied, and to obtain the value of the capacitance based on the determined current value and the detected value of the voltage of the capacitor to which the current having the determined current value is supplied.

6. The apparatus according to claim 5, further comprising a voltage detection device configured to detect a value of a voltage of the capacitor, and a supply device configured to supply a current having the determined current value to the capacitor,
wherein a transmission path which connects the supply device with the detector is shorter than a transmission path which connects the voltage detection device with the detector.

7. The apparatus according to claim 5, wherein the processor is configured to cause a charged particle beam to be incident on the detector for detecting an output from the detector via the resistor, during a period longer than that for detecting an output from the detector via the capacitor.

8. A method of manufacturing an article, the method comprising steps of:
performing drawing on a substrate using a drawing apparatus;

developing the substrate on which the drawing has been performed; and processing the developed substrate to manufacture the article, wherein the drawing apparatus performs drawing on the substrate with a charged particle beam, and includes:

a detector configured to detect a charged particle beam incident thereon;

a capacitor configured to be charged with an output from the detector in accordance with the charged particle beam incident on the detector;

a processor configured to detect a value of a voltage of the capacitor, and to obtain an intensity of the charged particle beam incident on the detector based on a value of a capacitance of the capacitor and the detected voltage value; and a resistor, wherein the processor is configured to detect an output from the detector in accordance with a charged particle beam incident on the detector through a voltage drop across the resistor, to supply a current, having a current value determined based on the detected output to the capacitor to detect a value of a voltage of the capacitor to which the current having the determined current value is supplied, and to obtain the value of the capacitance based on the determined current value and the detected value of the voltage of the capacitor to which the current having the determined current value is supplied.

9. A method of obtaining an intensity of a charged particle beam, the method comprising steps of:

detecting an output from a detector, on which a charged particle beam is incident, via a resistor based on a voltage drop across the resistor;

supplying a current, having a current value determined based on the detected output, to a capacitor to detect a value of a voltage of the capacitor to which the current having the determined current value is supplied;

obtaining a value of a capacitance of the capacitor based on the determined current value and the detected value of the voltage of the capacitor; and detecting an output from the detector, on which a charged particle beam is incident, via the capacitor to obtain an intensity of the charged particle beam based on a value of a voltage of the capacitor and the obtained value of the capacitance.

10. The method according to claim 9, wherein a charged particle beam is caused to be incident on the detector for detecting an output from the detector via the resistor, during a period longer than that for detecting an output from the detector via the capacitor.

* * * * *